US006597603B2

(12) United States Patent
Lambrache et al.

(10) Patent No.: US 6,597,603 B2
(45) Date of Patent: Jul. 22, 2003

(54) DUAL MODE HIGH VOLTAGE POWER SUPPLY FOR PROVIDING INCREASED SPEED IN PROGRAMMING DURING TESTING OF LOW VOLTAGE NON-VOLATILE MEMORIES

(75) Inventors: Emil Lambrache, Campbell, CA (US); George Smarandoiu, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 45 days.

(21) Appl. No.: 10/005,317

(22) Filed: Nov. 6, 2001

(65) Prior Publication Data

US 2003/0090940 A1 May 15, 2003

(51) Int. Cl.[7] ............................................. G11C 16/04
(52) U.S. Cl. .............................. 365/185.18; 365/185.11; 365/185.23
(58) Field of Search ....................... 365/185.18, 185.11, 365/185.23, 185.01

(56) References Cited

U.S. PATENT DOCUMENTS 5,663,918 A     9/1997  Javanifard et al. .......... 365/226
6,014,332 A     1/2000  Roohparvar ............ 365/185.33
6,069,519 A  *  5/2000  Song ............................ 327/536
6,125,056 A     9/2000  Chen et al. ............. 365/185.18
6,314,025 B1 * 11/2001  Wong ..................... 365/185.22
6,320,797 B1 * 11/2001  Liu ........................ 365/189.11
6,330,185 B1 * 12/2001  Wong et al. ........... 365/185.03

* cited by examiner

Primary Examiner—Hoai Ho
(74) Attorney, Agent, or Firm—Thomas Schneck (57) ABSTRACT

A dual mode high voltage power supply circuit using an external high voltage connected through an internal high voltage switch which determines whether the memory blocks of a non-volatile memory circuit are programmed in a first mode from an internal high voltage charge pump or are programmed in a second mode from an external high voltage power supply connected in parallel to the internal high voltage charge pump. When the dual mode high voltage power supply circuit is operating in the first mode using only its internal change pump high voltage, it operates in a low power, low-speed mode, programming only one or two bits at a time but allowing the charge pump area on the die to be small. When operating in the second mode, in which the external power supply high voltage is available, eight or more bits can be written to at the same time, thus allowing a fast programming mode without the need for increasing the size of the internal charge pump, thus eliminating the additional space and cost required to increase the die area.

20 Claims, 5 Drawing Sheets

DUAL MODE HIGH VOLTAGE POWER SUPPLY FOR PROVIDING INCREASED SPEED IN PROGRAMMING DURING TESTING OF LOW VOLTAGE NON-VOLATILE MEMORIES

TECHNICAL FIELD

The present invention relates generally to non-volatile memory integrated circuit devices, and more specifically to increasing the speed of programming such devices.

BACKGROUND ART

Non-volatile memory devices are used in the semiconductor integrated circuit industry in logic systems, such as microprocessors, and are used for creating storage elements such as memory boards or solid state hard disks. A conventional non-volatile or flash memory device includes a plurality of memory cells typically organized in the plurality of memory sectors. Within each memory sector, the memory cells are arranged in a array comprising a plurality of rows and a plurality of columns. A plurality of word lines are coupled to the respective rows of the memory cells, and a plurality of bit lines are coupled to the respective columns of the memory cells. Each memory cell is capable of storing one bit. During the operation of a conventional non-volatile memory, a memory cell is programmed by supplying a current from a high voltage power supply to the drain of the memory cell through the respective bit lines to which the memory cells are connected when the non-volatile memory is in a conventional embedded program mode.

With the advent of low and very low voltage flash non-volatile memories, operated at or below 2.7 V, the die area occupied by the on-chip voltage multiplier charge pump becomes prohibitively large. The reason for this increase in the size of the charge pump is explained below.

The open circuit voltage $V_{MO}$ of a n-stage charge pump is approximately given by formula (1)

$$V_{MO} = n(V_{DD} - V_{TH}) \tag{1}$$

where n=numbers of stages $V_{DD}$=power supply voltage $V_{TH}$=average threshold voltage for NMOS transistors in the charge pump chain.

Figure 4:
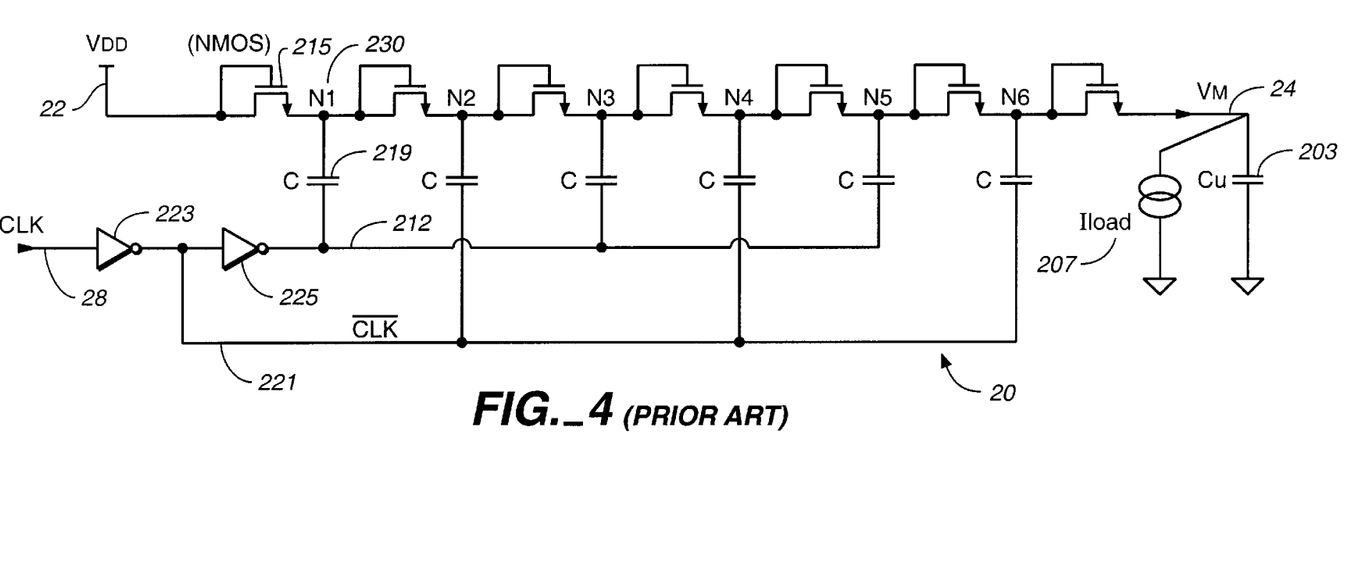
FIG. 4 is an electrical schematic diagram of the charge pump circuit used in the present invention and known in the prior art.

With reference to FIG. 4, a state-of-the-art charge pump 20 is shown. The internal charge pump 20 receives a low voltage power supply $V_{DD}$ at an input terminal 22 and produces a programming voltage $V_M$ at an output terminal 24. A plurality of diode-connected NMOS transistors 215 are connected in series between the input terminal 22 and the output terminal 24. Between each of the diode transistors 215 is a node 230. A clock signal CLK is supplied to a clock input 28 and is inverted by an inverter 223 to provide an inverted clock signal $\overline{CLK}$ 221. The inverted clock signal 221 is inverted again by a second inverter 225 to provide a clock signal 212. Capacitors 219 are connected between each of the nodes 230 and one of the clock signals 212, 221. Alternating nodes (N1, N3, N5) are connected to the clock signal line 212 through one of the capacitors 219, while the other nodes (N2, N4, N6) are connected through a capacitor 219 to the inverted clock signal line 221.

In FIG. 4, the internal nodes 230 are labeled $N_k$, k=1, 2 ... 6. The average voltage at node $N_k$ is $$\tilde{V}_k = k(V_{DD} - \tilde{V}_{THk}) \tag{2}$$

The average threshold voltage $\tilde{V}_{THk}$ of the NMOS transistor at node $N_k$ is affected by the substrate bias provided by the average node voltage $\tilde{V}_k$. Formula (3) provides an approximation of the substrate bias effect on increasing $\tilde{V}_{THk}$:

$$\tilde{V}_{THk} = V_{THo} + \gamma(\sqrt{\tilde{V}_k + \phi_B} - \sqrt{\phi_B}) \tag{3}$$

Where $\tilde{V}_{THo}$ is the threshold voltage at zero substrate bias, $\gamma$ is the substrate bias coefficient and $\phi_B$ is the built in substrate (bulk) voltage. Typical values are:

$V_{THo}$=0 for NMOS native transistors (No enhancement implant)

$\gamma \equiv 0.1 \div 0.9 \sqrt{V}$ $\phi_B \equiv 0.6 \div 0.7V$

Figure 5:
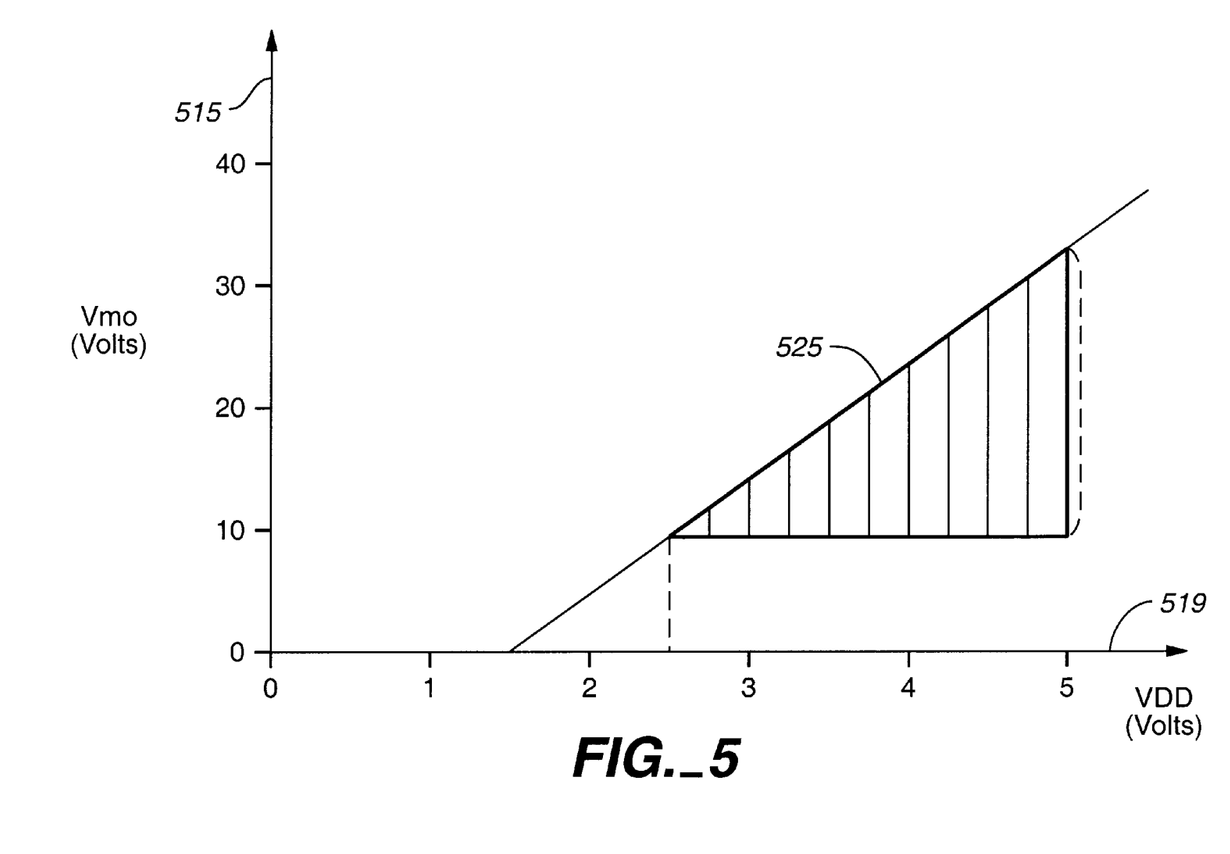
FIG. 5 is a graph showing the relationship between the low voltage power supply $V_{DD}$ and the open circuit voltage of the charge pump of FIG. 4.

A trial and error iterative computation for $V_{MO}$ and $\tilde{V}_{TH}$ in formula (1) yields a typical value of $\tilde{V}_{TH}$=1.5V for n=8÷10 stages. With reference to FIG. 5, the open circuit voltage $V_{MO}$ 515 of the charge pump is plotted with respect to the power supply voltage $V_{DD}$ 519. Under load, $V_M$ has the approximate behavior:

$$\tilde{V}_M = \tilde{V}_{MO} - n\frac{T}{C} \cdot \tilde{I}_{LOAD} \tag{4}$$

where T=clock period, C=capacitor value. Assuming that $\tilde{V}_{Mnominal}$ should be $\tilde{V}_{Mnominal}$=10V as imposed by the hot electron injection mechanism, the current capability of the charge pump is:

$$I_{LOAD\max} = \frac{\tilde{V}_{Mo} - \tilde{V}_{Mnominal}}{n\frac{T}{C}} \tag{5}$$

provided that $\tilde{V}_{Mo} > \tilde{V}_{Mnominl}$. From FIG. 5, it can be seen from the graph 525 that the current capability 515 decreases dramatically for lower values of $V_{DD}$ 519.

Moreover, if one assumes that the programming cell current (Flash hot electron injection mechanism) is $I_{PRG\ CELL} \equiv 200\ \mu A$., then the number of bits (q), i.e. memory cells, which can be simultaneously programmed is:

$$q = \frac{I_{LOAD\max}}{I_{PRG\ CELL}} = \frac{\tilde{V}_{Mo} - \tilde{V}_{Mnominal}}{n \cdot \frac{T}{C} \cdot I_{PRG\ CELL}} \tag{6}$$

$$q = \frac{n(V_{DD} - \tilde{V}_{TH}) - V_{Mnominal}}{n \cdot \frac{T}{C} \cdot I_{PRG\ CELL}} \tag{7}$$

$$q = \cdot \frac{C}{T} \cdot \frac{n(V_{DD} - \tilde{V}_{TH}) - V_{Mnominal}}{I_{PRG\ CELL}} \tag{8}$$

Assuming that C=100 pF and T=100 ns, and using Equation (8) with the other numerical values assumed above, the following results are obtained:

n=10

$\tilde{V}_{TH}$=1.5V $V_{Mnominal}$=10V $I_{PREG\ CELL}$=200 $\mu$A

C=100 pF

T=100 ns $$q = [5(V_{DD} - 2.5)] \text{bits(with } V_{DD} \text{ in volts)} \tag{9}$$

Table 1 shows, in a second column, the number of bits that can be programmed at one time when the capacitance is 100 pF, based on various values of the power supply voltage $V_{DD}$, shown in the first column. The third column of Table 1 shows the corresponding capacitance value when the programming rate is fixed at eight bits at a time for each of the power supply voltage $V_{DD}$ values of the first column.

TABLE 1

| VDD (V) | if C = 100 pF q (bits) | C for 8 bits at a time (pF) |
|---|---|---|
| 5 | [12.5] 12 | 64 |
| 4.5 | [10] 10 | 80 |
| 4 | [7.5] 7 | 107 |
| 3.5 | [5] 5 | 160 |
| 3.0 | [2.5] 2 | 320 |
| 2.5 | [0] 0 | ∞ |

([] is integer part)

The following results can be observed from Table 1. At $V_{DD}$=3V, one can either have C=100 pF and write only 2 bits at a time or, one can have C=320 pF and write 8 bits at a time. For comparison, at $V_{DD}$=4.5V, one can either have C=100 pF and write 10 bits at a time or have C=80 pF and write 8 bits at a time. Therefore, to be able to write 8 bits at a time, and to reduce the internal voltage from $V_{DD}$=4.5V down to $V_{DD}$=3V, the area of the charge pump capacitors has to be increased by 400%

$$\left(\frac{320 \text{ pF}}{80 \text{ pF}}\right),$$

which is prohibitively large.

Attempts have been made in the prior art to increase the speed of programming flash non-volatile memories. U.S. Pat. No. 5,663,918 to Javanifard et al. discloses an integrated circuit having internal power supplies including circuitry for selecting either the external supply voltages or the internal power supplies to supply voltages to the remaining circuitry of the integrated circuit. The integrated circuit comprises voltage detector circuits for detecting the external voltage levels and a control circuit for selecting either the external supply voltages or the internal power supplies in response to the detected external voltages. The patent describes the mutually exclusive use of the external power supply and the operating supply voltage driven from the internal charge pump. Additionally, the regulation method is based upon the control of the frequency of the charge pump by means of a voltage control oscillator.

U.S. Pat. No. 6,014,332 to Roohparvar discloses a flash memory which includes circuitry to determine how many memory cells can be programmed in a single write operation by measuring the power available for programming.

It is the object of the present invention to provide a dual mode power supply for speeding up the programming of flash nonvolatile memories without having to increase the charge pump size when the flash memories are operated with low voltage power supplies.

It is a further object of the present invention to provide a dual mode high voltage power supply that has a first mode that programs using only the internal charge pump driven from the low voltage power supply VDD and a second mode that programs using the internal charge pump in conjunction with an external high voltage power supply in order to program a larger amount of memory cells simultaneously.

SUMMARY OF THE INVENTION

The above objects have been achieved by a dual mode high voltage power supply circuit having an external high voltage switch which determines whether the memory blocks of a nonvolatile memory circuit are programmed by an internal high voltage produced by an internal charge pump or are programmed by an external power supply high voltage in conjunction with the internal charge pump high voltage. When the dual mode power supply circuit is operating only on its internal charge pump high voltage, in order to keep the die area small, only one or two bits would be programmed at the same time. This is a first mode of operation. However, when the external power supply high voltage is available, eight or more bits can be written to at the same time, thus the throughput is four or more times larger. This is a second mode of operation. The switching from slow to fast programming mode can be dictated by a command or can be automatically executed by the flash memory itself based upon sensing the external voltage.

The dual mode power supply circuit includes the use of hysteresis comparator as a means of regulating the programming voltage by turning on or off the constant frequency clocks feeding the internal charge pump and additionally in the fast programming mode by turning on or off the external voltage switch. (The second power voltage is external but the switch controlling its distribution is internal.) This feedback loop built by the means of the hysteresis comparator allows the programming voltage from the internal charge pump to be matched by the external power supply as this programming voltage value is very critical for the overall performance of the non-volatile memory cells (both data retention and cell endurance).

BEST MODE FOR CARRYING OUT THE INVENTION

Figure 1:
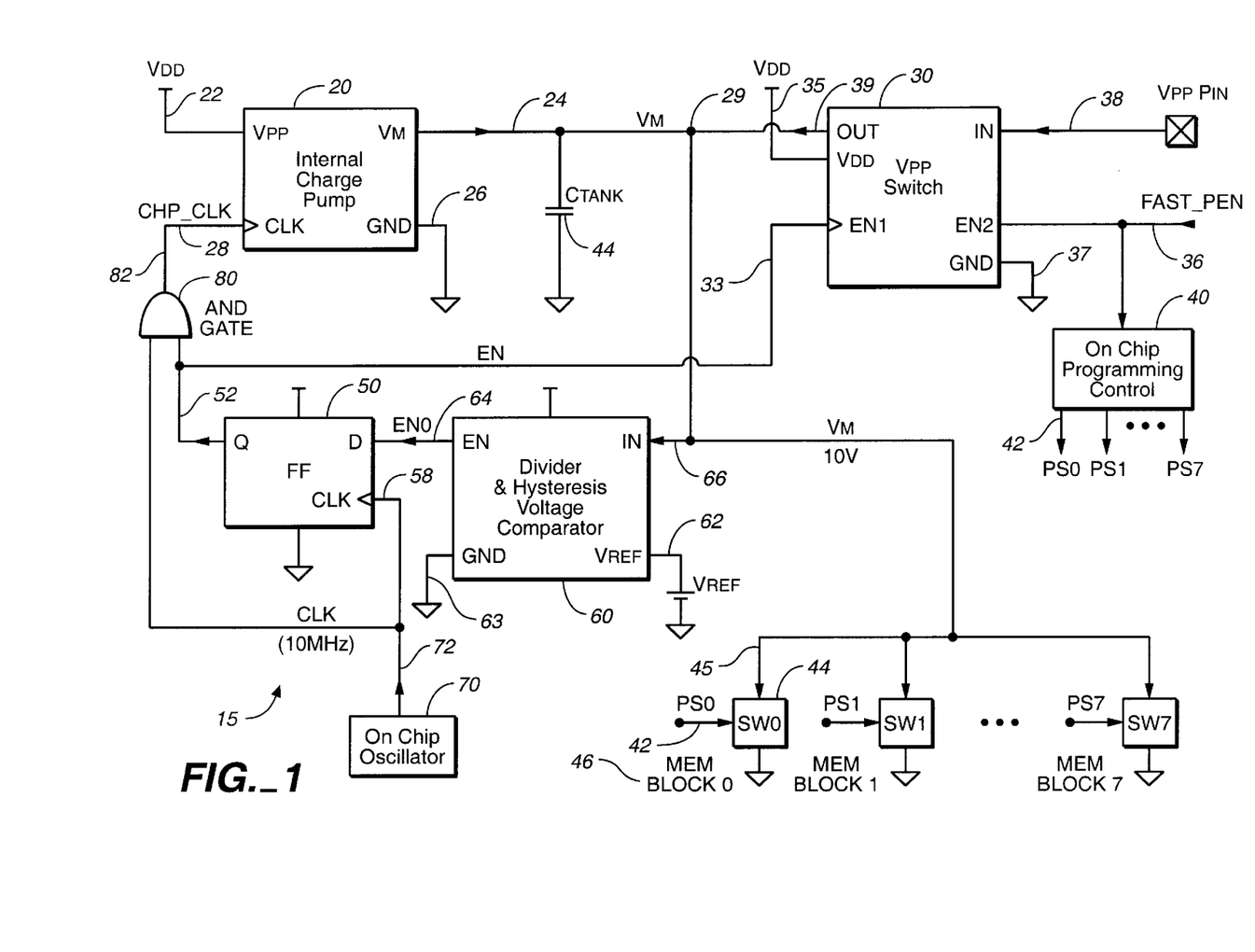
FIG. 1 is a block diagram of the dual mode high voltage power supply circuit of the present invention.

With reference to FIG. 1, the dual mode high voltage power supply circuit 15 of the present invention is shown. An internal charge pump 20 receives the regular power supply low voltage $V_{DD}$ at an input terminal 22. The charge pump 20 receives a timing signal CHP-CLK at a clock terminal 28. A ground terminal 26 is connected to signal ground. The internal charge pump produces a programming voltage $V_M$ at an output terminal 24. A tank capacitor 44 is connected between the programming voltage output 24 and signal ground. The programming voltage $V_M$ is supplied to a common node 29 and then is used to program the plurality of memory blocks 46. Each memory block 46 is connected to a memory block switch 44 having an input terminal 45 to receive the programming voltage $V_M$ and a programming control terminal 42 to receive a programming control signal.

The timing for the power supply circuit 15 is generated from an on-chip oscillator 70 which produces a clock signal 72. The clock signal 72 is supplied to a clock terminal 58 of a flip-flop circuit 50 which produces an output 52. The output 52 of the flip-flop 50 and the clock signal 72 are input into an AND gate 80, and the output of the AND gate 80 is the CHP-CLK clock timing signal for the charge pump 20.

The dual mode high voltage power supply circuit 15 also includes a divider and hysteresis voltage comparator circuit 60. The hysteresis voltage comparator circuit 60 receives a reference voltage $V_{ref}$ at a reference terminal 62 and also receives the programming voltage $V_M$ at an input terminal 66. The output of the hysteresis voltage comparator circuit 60 is an analog enable signal $EN_O$ which is produced at an enable output 64. The analog enable signal $EN_O$ is provided as the data input to the flip-flop 50.

An external voltage switch 30 determines whether the programming is conducted in the normal slower programming mode, in which only the low voltage power supply $V_{DD}$ is used and only one or two bits are programmed at the same time, or whether the programming is conducted in the faster programming mode in which the high voltage power supply $V_{PP}$ is used in conjunction with the low voltage power supply $V_{DD}$, and eight or more bits are programmed at once. The external voltage switch 30 receives the high voltage $V_{PP}$ at an input terminal 38 and also receives a first enable signal EN at an enable terminal 33. The first enable signal EN is derived from the output of the flip-flop circuit 50. At a second enable terminal 36, the external voltage switch receives the fast program enable signal FAST-PEN, which is used to activate or deactivate the switch 30. A ground terminal 37 is connected to signal ground. The switch 30 also has a terminal 35 for receiving the low voltage power supply $V_{DD}$. The external voltage switch 30 produces the programming voltage on an output terminal 39 which joins with the output of the charge pump 24 at the common node 29.

The internal charge pump 20 can be implemented using the prior art state-of-the-art charge pump that was described with reference to FIG. 4 or can be implemented by any equivalent means that is known in the art. Similarly, the hysteresis voltage comparator circuit 60 can be implemented using any known hysteresis voltage comparator circuit, so long as the resulting program voltage is regulated to the internal voltage value. The desired result of the hysteresis voltage comparator circuit 60 is a constant internal load line when the regulator is on, so that the programming voltage can be matched by the external power supply. The AND gate 80 serves to gate the clock feeding the internal charge pump 20 in order to provide a complete clock cycle. Without the AND gate 80, the systolic two-phase charge pump described with regard to FIG. 4 would not work properly. The flip-flop circuit 50 rounds up the output analog enable signal $EN_o$ of the hysteresis voltage comparator 60 to produce the enable signal EN which changes only on positive edges of the clock. In this way, the internal charge pump 20 will receive the clock CLK and the inverted clock CLK signals always in pairs of positive pulses through the signal CHP-CLK.

Figure 2:
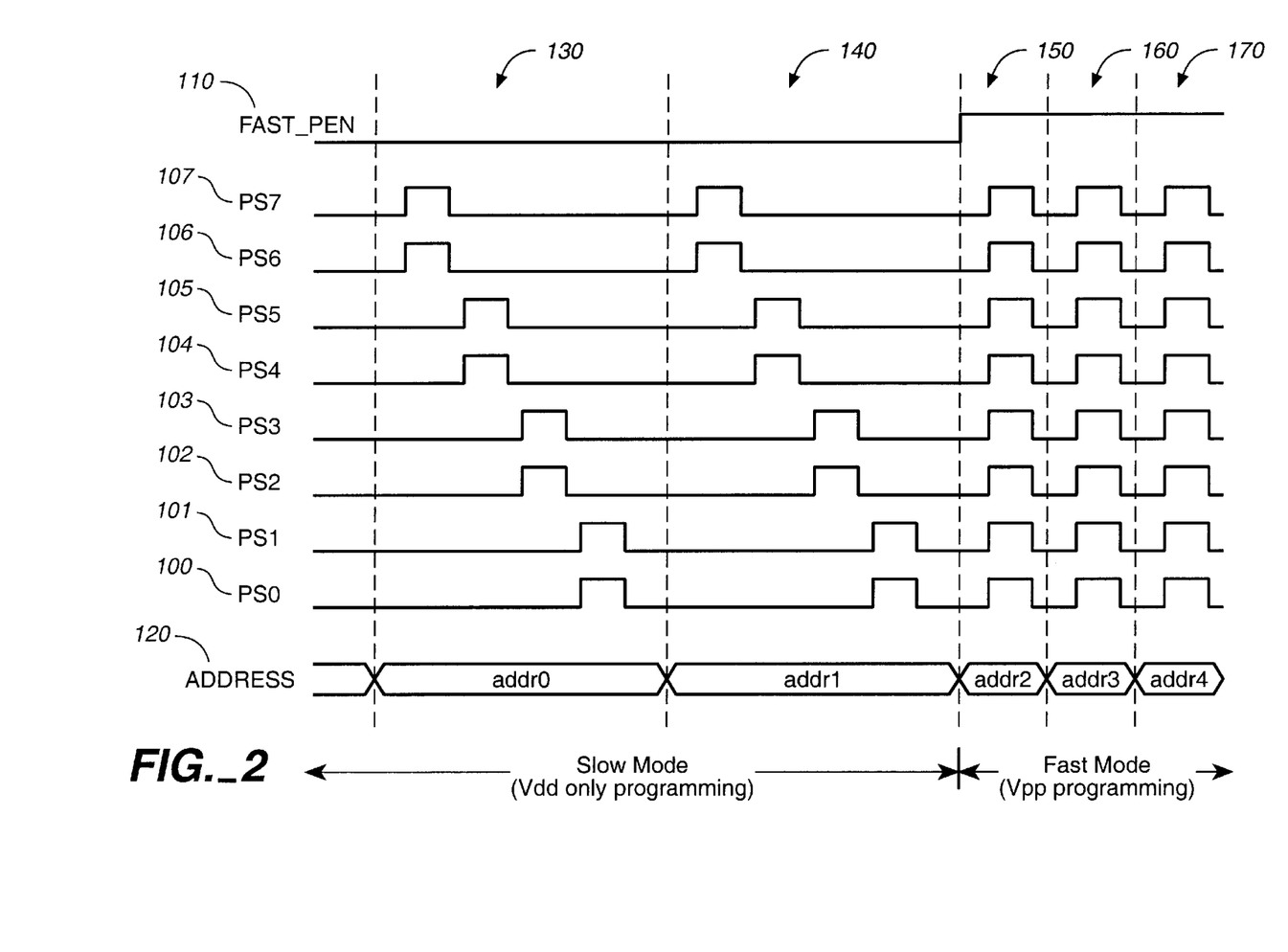
FIG. 2 is a timing diagram of the programming signals for programming the memory blocks.

With reference to FIG. 2, the signal FAST-PEN, fast program enable 110, is used to enable the external voltage switch 30 and also to change the behavior of the program control block 40. With reference to FIG. 2, the program select signals (PS0) 100 through (PS7) 107 enable a memory block switch 44 to connect the high voltage programming signal $V_M$ with one of the memory blocks 46 (memory blocks 0–7). Each memory block 46 corresponds to a bit in any byte stored in the flash memory. As shown in FIG. 2, when the fast program enable signal 100 is not activated (low), the dual mode high voltage power supply operates in the slower programming mode in which it only uses the internal charge pump driven by the low voltage $V_{DD}$ for programming. In this case, at each address, only two bits are programmed at any one time. For the first byte of data 130 it can be seen that the program select signals (PS7) 107 and (PS6) 106 are activated for programming at the same time and then next pair of program select signals (PS5) 105 and (PS4) 104 are activated after the first pair of signals (PS5) 105 and (PS4) 104 finish programming. This continues until all of the memory blocks have been programmed at a first address (addr 0) 130. At the next address, (addr 1) 140, the circuit is still operating in the slow programming mode, such that two bits are programmed at one time.

At the next address, (addr 2) 150, the fast program enable signal 110 is activated (high). As shown in FIG. 2, in the fast programming mode, all of the program select signals (PS0–PS7) 100–107 are activated at the same time. This allows all eight memory blocks to be programmed at once. This fast programming mode continues, while the fast program enable signal 110 is activated at the next addresses, (addr 3) 160 and (addr 4) 170. At each of these addresses, the dual mode high voltage power supply is in the fast programming mode which allows 8 bits or more at a time to be programmed.

During the fast programming mode, the internal charge pump circuit is operating even when the external voltage power supply is on. This is to maintain at least the same level of noise induced by the internal charge pump during testing in the fast programming mode as there is in the normal operation slow programming mode. If this were not the case, the testing would be too favorable for the device noise performance. The use of the same regulator to control the internal high voltage and additionally the external high voltage in all cases further ensures that testing is representative of the full load normal operation.

Figure 3:
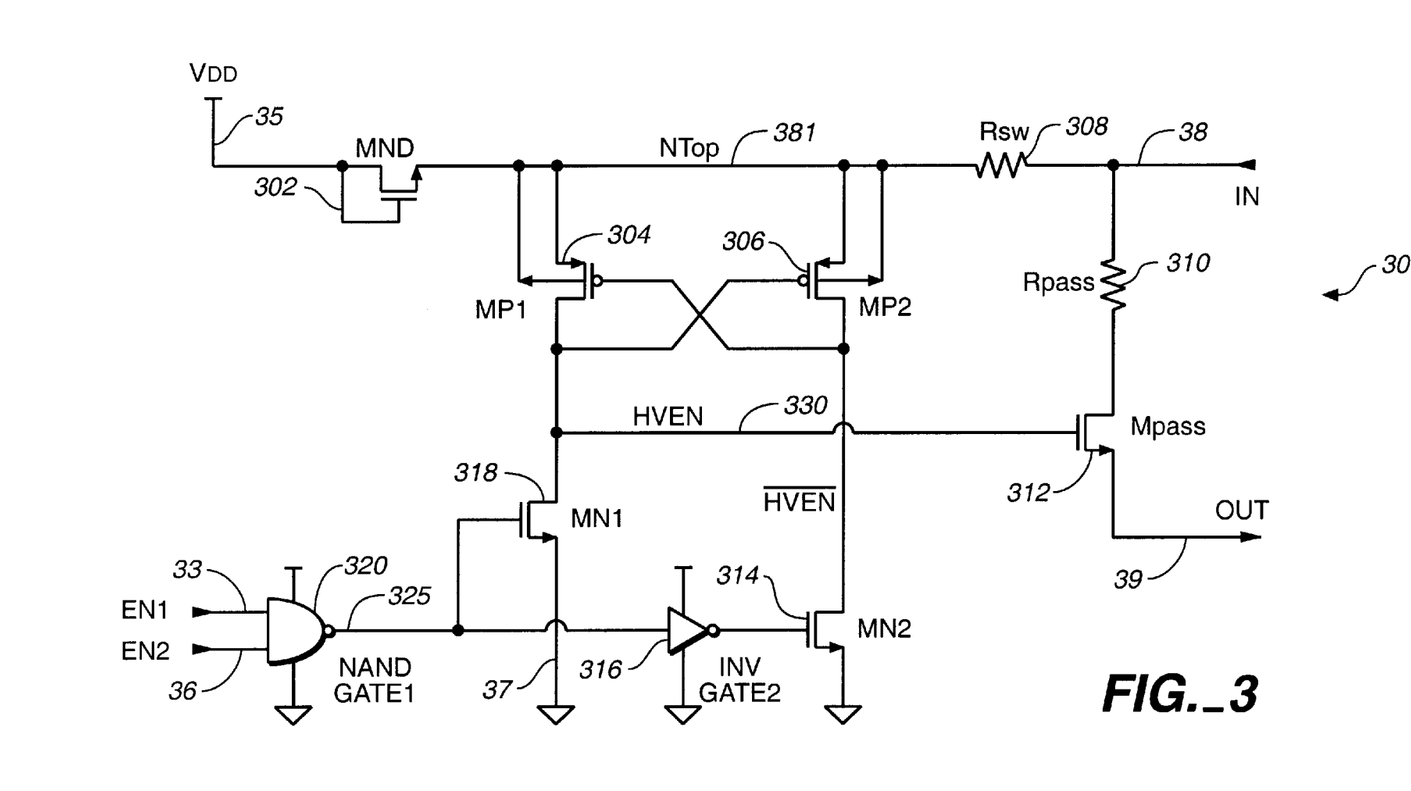
FIG. 3 is an electrical schematic diagram of the external voltage switch used in the dual mode high voltage power supply circuit of the present invention.

With reference to FIG. 3, the details of the external high voltage power switch 30 are shown. The external high voltage power switch 30 includes an input terminal 38 which receives the external power supply high voltage $V_{PP}$ and an output terminal 39 on which is produced the programming voltage $V_M$. A switch resistor 308 is connected to the input terminal 38 and is in series with a diode-connected NMOS transistor 302 which is connected between the switch resistor 308 and the low voltage supply terminal $V_{DD}$ 35. A pair of PMOS transistors 304, 306 are connected in a cross-coupled manner between the diode 302 and the switch resistor 308. A high voltage enable line HVEN 330 is produced at the drain terminal of the first 304 of the pair of PMOS transistors. A NAND gate 320 receives a first enable signal EN1 at a first input terminal 33 and a second enable signal EN2 at a second input terminal 36. A NAND gate 320 produces a gate output on a terminal 325. The NAND gate output is connected to the gate of an NMOS transistor 318 which has a drain connected to the high voltage enable line 330 and a source terminal connected to ground 37. The NAND gate output 325 is also input to an inverter 316, the output of the inverter 316 being supplied to the gate of a second NMOS transistor 314. The NMOS transistor 314 has a source terminal connected to ground and a drain terminal connected to the drain terminal of the second PMOS transistor 306. The high voltage enable line 330 supplies the gate terminal of NMOS transistor 312. NMOS transistor 312 is a pass transistor and is connected at a drain terminal through a pass resistor 310 to the input terminal 38. The source terminal of pass transistor 312 is connected to the output terminal 39.

The cross coupling of PMOS transistors 304, 306 provides a positive loop which restores the full input voltage level on the high voltage enable line 330. Because the supply low voltage $V_{DD}$ at terminal 35 is much smaller than the external supply high voltage $V_{PP}$ supplied at terminal 38, the internal supply voltage drive presented by the NAND gate 320 and the inverter 316 on the gates of transistors 318 and 314 may be insufficient to fight the external supply high voltage drive present on the gates of transistors 304, 306. For this reason, the switch resistor 308 will drop the voltage on the node connected to the sources of the transistors 304, 306 because of the total current flowing through transistors 318 and 304 and between 306 and 314 during the switching time.

The voltage on node $N_{TOP}$ 381 is being limited by the diode connected transistor 302 to a value just below the supply low voltage $V_{DD}$. This results in the switching time being shortened in comparison with a full collapse of the node $N_{TOP}$ voltage. The switch resistor 308 should be sufficiently large to allow the node $N_{TOP}$ 381 voltage to drop to the low voltage supply $V_{DD}$ level so that transistors 318 or 314 can switch/toggle the current through the PMOS transistors 304, 306. After the switching, the current through the switch resistor 308 is zero, so the voltage on HVEN 330 goes to either the full external high voltage $V_{PP}$ (as on the input terminal 38) or all the way to ground potential. In this way, the pass transistor $M_{PASS}$ 312 is fully turned on or off. The pass resistor $R_{PASS}$ 310 must match the order of magnitude of the output impedance of the internal charge pump.

Referring to FIG. 1, the hysteresis voltage comparator 60 works based upon the ripple on the programming voltage $V_M$ to turn on or off the charge pump 20. The charge pump 20 functions more like a current generator than a voltage generator. For this reason, if the external supply voltage $V_{PP}$ switch 30 has too low of a series impedance, the regulation feedback loop would not work properly because of the excessive ripple created the external supply voltage by $V_{PP}$ on the tank capacitor $C_{TANK}$ 44. The charge pump output impedance is given by formula (10) which is derived from formula (4) above:

$$R_{CHP_{Out}} = \frac{-\Delta V_M}{\Delta I_{LOAD}} = n\frac{T}{C} \quad (10)$$

Using the numerical values from formula (9), this results in:

$$R_{CHP_{Out}} = (10)100\,\frac{ns}{100\,pF} = 10\,k\Omega$$

The purpose of the external supply voltage $V_{PP}$ is to boost the current capability of the internal charge pump. Assuming that the internal charge pump can supply 2 bits at a time, then in order to program eight bits, the external supply voltage $V_{PP}$ has to supply the remaining six bits, hence $$R_{PASS} = \left(\frac{\text{\# of internal programmable bits}}{\text{\# of all bits} - \text{\# of internal programmable bits}}\right) \quad (11)$$

$$R_{PASS} = \frac{2}{8-2} \cdot 10\,k\Omega = 3.3\,k\Omega$$

To match the external supply voltage $V_{PP}$ load line with the internal charge pump load line, the external supply voltage $V_{PP}$ needs to be approximately equal to the programming voltage $V_{MO}$. These computations assume that the pass transistor $M_{PASS}$ 312 has a series resistance included in the resistance of the pass resistor $R_{PASS}$ 310.

The dual mode high voltage power supply architecture of the present invention enables fast parallel programming from an external power supply high voltage plus the internal charge pump voltage during testing for low voltage flash memories which have a slow serial access. The dual mode power supply circuit also allows one to program in a slower, low current, serial programming mode, which allows the internal charge pump to be of considerably smaller area on the silicon die.

What is claimed is:

1. A dual mode high voltage power supply circuit for providing increased speed in programming during testing of low voltage nonvolatile memories, said circuit comprising:

a charge pump receiving an external power supply low voltage ($V_{DD}$) on an input and producing a programming high voltage ($V_M$) on an output, the charge pump having a clock input for receiving a timing signal;

an external high voltage switch having a first input terminal, a second input terminal, an output terminal, and a plurality of enable inputs, said external high voltage switch receiving an external power supply high voltage ($V_{PP}$) at the first input terminal, receiving the external power supply low voltage ($V_{DD}$) at the second input terminal and producing the programming high voltage ($V_M$) at the output terminal, said output terminal being connected to the output of the charge pump at a common programming node, the external voltage switch being activated and deactivated by a fast program enable signal applied to a first one of the enable inputs;

a plurality of nonvolatile memory blocks, each nonvolatile memory block being connected to a memory block switch having a programming input terminal connected to the common programming node to receive the programming voltage, and each memory block switch having a control input terminal for receiving a signal to activate or deactivate the memory block switch, each of the nonvolatile memory blocks being programmed with the programming voltage when its respective memory block switch is activated;

a programming control circuit having an input terminal for receiving the fast program enable signal and a plurality of output terminals being connected to the control input terminals of the memory block switches; and means for generating the timing signals for the charge pump, whereby the dual mode high voltage power supply operates in a first programming mode when the external high voltage switch is deactivated and the dual mode high voltage power supply operates in a second programming mode when the external high voltage switch is activated.

2. The dual mode high voltage power supply circuit of claim 1 wherein the means for generating the timing signals includes:

an oscillator circuit providing a clock signal;

a divider and hysteresis comparator circuit for providing regulation of the programming voltage, the divider and hysteresis comparator circuit receiving the programming voltage on a signal input and a reference voltage on a reference input and producing an analog enable signal on an output terminal;

a flip-flop circuit receiving the clock signal at a clock terminal and the analog enable signal at a data terminal and producing a timing enable signal at an output terminal; and a logic gate receiving the clock signal at a first input terminal and the timing enable signal at a second input terminal and producing the timing signals at an output terminal.

3. The dual mode high voltage power supply of claim 2 wherein the timing enable signal is supplied to a second one of the enable inputs of the external high voltage switch.

4. The dual mode high voltage power supply of claim 1 wherein the programming high voltage for programming the nonvolatile memory blocks is generated from the charge pump when the external voltage switch is deactivated.

5. The dual mode high voltage power supply of claim 4 wherein two of the nonvolatile memory blocks are programmed at the same time.

6. The dual mode high voltage power supply of claim 1 wherein the programming high voltage for programming the nonvolatile memory blocks is generated from both the external power supply high voltage and the charge pump when the external voltage switch is activated.

7. The dual mode high voltage power supply of claim 6 wherein at least eight of the nonvolatile memory blocks are programmed at the same time.

8. The dual mode high voltage power supply of claim 1 wherein the external voltage switch comprises:
   a diode connected to the second input terminal;
   a switch resistor connected to the first input terminal;
   a pair of PMOS transistors connected in a cross coupled manner between the diode and the switch resistor, a high voltage enable line being produced at a drain terminal of one of the pair of PMOS transistors;
   a first logic gate receiving the plurality of enable inputs and producing a first gate output on an output terminal;
   a first NMOS transistor having a drain terminal connected to the high voltage enable line, a source terminal connected to a ground potential and receiving the first gate output on a gate terminal;
   a second logic gate receiving the first gate output at an input terminal and producing a second gate output at an output terminal;
   a second NMOS transistor having a drain terminal connected to a drain terminal of the other of the pair of PMOS transistors, a source terminal connected to a ground potential and receiving the second gate output on a gate terminal;
   a pass transistor having a gate terminal connected to the high voltage enable line, a drain terminal connected to the second input terminal, and a source terminal connected to the output terminal; and
   a pass resistor connected in series between the drain of the pass transistor and the second input terminal.

9. A dual mode high voltage power supply circuit for providing increased speed in programming during testing of low voltage nonvolatile memories, said circuit comprising:
   an internal charge pump receiving an external power supply low voltage ($V_{DD}$) on an input and producing a programming high voltage ($V_M$) on an output, the charge pump having a clock input for receiving a timing signal;
   an external high voltage switch having a first input terminal, a second input terminal, an output terminal, and a plurality of.enable inputs, said external high voltage switch receiving an external power supply high voltage ($V_{PP}$) at the first input terminal, receiving the external power supply low voltage ($V_{DD}$) at the second input terminal and producing the programming high voltage ($V_M$) at the output terminal, the external high voltage switch being activated by a fast program enable signal applied to a first one of the enable inputs, the dual mode high voltage power supply operating in a first programming mode in which the programming voltage is generated from solely the charge pump when the external high voltage switch is deactivated and the dual mode high voltage power supply operating in a second programming mode in which the programming high voltage is generated from both the charge pump and the external power supply high voltage when the external high voltage switch is activated, said output terminal being connected to the output of the charge pump at a common programming node;
   a plurality of nonvolatile memory blocks, each nonvolatile memory block being connected to a memory block switch having a programming input terminal connected to the common programming node to receive the programming high voltage, and each memory block switch having a control input terminal for receiving a signal to activate or deactivate the memory block switch, each of the nonvolatile memory blocks being programmed with the programming high voltage when its respective memory block switch is activated;
   a programming control circuit having an input terminal for receiving the fast program enable signal and a plurality of output terminals being connected to the control input terminals of the memory block switches; and
   means for generating the timing signals for the charge pump.

10. The dual mode high voltage power supply circuit of claim 9 wherein the means for generating the timing signals includes:
    an oscillator circuit providing a clock signal;
    a divider and hysteresis comparator circuit for providing regulation of the programming high voltage, the divider and hysteresis comparator circuit receiving the programming high voltage on a signal input and a reference voltage on a reference input and producing an analog enable signal on an output terminal;
    a flip-flop circuit receiving the clock signal at a clock terminal and the analog enable signal at a data terminal and producing a timing enable signal at an output terminal; and
    a logic gate receiving the clock signal at a first input terminal and the timing enable signal at a second input terminal and producing the timing signals at an output terminal.

11. The dual mode high voltage power supply of claim 10 wherein the timing enable signal is supplied to a second one of the enable inputs of the external high voltage switch.

12. The dual mode high voltage power supply of claim 9 wherein the external high voltage switch is deactivated and two of the nonvolatile memory blocks are programmed at the same time.

13. The dual mode high voltage power supply of claim 9 wherein the external high voltage switch is activated and at least eight of the non-volatile memory blocks are programmed at the same time.

14. The dual mode high voltage power supply of claim 9 wherein the external voltage switch comprises:
    a diode connected to the second input terminal;
    a switch resistor connected to the first input terminal;
    a pair of PMOS transistors connected in a cross coupled manner between the diode and the switch resistor, a high voltage enable line being produced at a drain terminal of one of the pair of PMOS transistors;
    a first logic gate receiving the plurality of enable inputs and producing a first gate output on an output terminal;

a first NMOS transistor having a drain terminal connected to the high voltage enable line, a source terminal connected to a ground potential and receiving the first gate output on a gate terminal;

a second logic gate receiving the first gate output at an input terminal and producing a second gate output at an output terminal;

a second NMOS transistor having a drain terminal connected to a drain terminal of the other of the pair of PMOS transistors, a source terminal connected to a ground potential and receiving the second gate output on a gate terminal;

a pass transistor having a gate terminal connected to the high voltage enable line, a drain terminal connected to the second input terminal, and a source terminal connected to the output terminal; and a pass resistor connected in series between the drain of the pass transistor and the second input terminal.

15. A dual mode high voltage power supply circuit for providing increased speed in programming during testing of low voltage nonvolatile memories, said circuit comprising:

a charge pump receiving an external power supply low voltage ($V_{DD}$) on an input and producing a programming high voltage ($V_M$) on an output, the charge pump having a clock input for receiving a timing signal;

an external voltage switch having a first input terminal, a second input terminal, an output terminal, and a plurality of enable inputs, said external voltage switch receiving an external power supply voltage ($V_{PP}$) at the first input terminal, receiving the external power supply low voltage ($V_{DD}$) at the second input terminal and producing the programming high voltage ($V_M$) at the output terminal, the external voltage switch being activated by a fast program enable signal applied to a first one of the enable inputs, the dual mode high voltage power supply operating in a first programming mode in which the programming high voltage is generated from solely the charge pump when the external voltage switch is deactivated and the dual mode high voltage power supply operating in a second programming mode in which the programming voltage is generated from both the charge pump and the external power supply high voltage when the external voltage switch is activated, said output terminal being connected to the output of the charge pump at a common programming node;

a plurality of nonvolatile memory blocks, each nonvolatile memory block being connected to a memory block switch having a programming input terminal connected to the common programming node to receive the programming voltage, and each memory block switch having a control input terminal for receiving a signal to activate or deactivate the memory block switch, each of the nonvolatile memory blocks being programmed with the programming voltage when its respective memory block switch is activated;

a programming control circuit having an input terminal for receiving the fast program enable signal and a plurality of output terminals being connected to the control input terminals of the memory block switches;

an oscillator circuit providing a clock signal; and a divider and hysteresis comparator circuit for providing regulation of the programming voltage, the divider and hysteresis comparator circuit receiving the programming high voltage on a signal input and a reference voltage on a reference input and producing an analog enable signal on an output terminal.

16. The dual mode high voltage power supply of claim 15 further comprising:

a flip-flop circuit receiving the clock signal at a clock terminal and the analog enable signal at a data terminal and producing a timing enable signal at an output terminal; and a logic gate receiving the clock signal at a first input terminal and the timing enable signal at a second input terminal and producing the timing signals at an output terminal.

17. The dual mode high voltage power supply of claim 15 wherein the programming high voltage has a value that is regulated by the hysteresis comparator circuit to produce a maximal load line that is the same in both operating modes.

18. The dual mode high voltage power supply of claim 17 wherein the charge pump has an operating clock frequency and an output impedance, said operating clock frequency and output impedance both being constant.

19. The dual mode high voltage power supply of claim 18 wherein the output impedance and the programming voltage are matched by the external power supply high voltage through the means of an internal pass resistor and the external voltage switch.

20. The dual mode high voltage power supply of claim 15 wherein a first number of non-volatile memory blocks are programmed at the same time when the external voltage switch is activated and a second number of non-volatile memory blocks are programmed at the same time the external voltage switch is deactivated, said first number being greater than said second number.

* * * * *

UNITED STATES PATENT AND TRADEMARK OFFICE
CERTIFICATE OF CORRECTION

PATENT NO.    : 6,597,603 B2
DATED         : July 22, 2003
INVENTOR(S)   : Emil Lambrache et al.

It is certified that error appears in the above-identified patent and that said Letters Patent is hereby corrected as shown below:

Column 2,
Lines 12-15, $$V_{THo} \equiv 0 \text{ for NMOS native transistors (No enhancement implant)}$$
$$\gamma \equiv 0.1 \div 0.9\sqrt{V}$$
$$\phi_B \equiv 0.6 \div 0.7V$$

should read $$V_{THo} \cong 0 \text{ for NMOS native transistors (No enhancement implant)}$$
$$\gamma \cong 0.1 \div 0.9\sqrt{V}$$
$$\phi_B \cong 0.6 \div 0.7V$$

Lines 41-42, equation "$I_{PRG\ CELL} \equiv 200\mu A$" should read -- $I_{PRG\ CELL} \cong \mu A$ --

Column 3,
Line 61, seventh word: "VDD" should read -- $V_{DD}$ --

Column 7,
Line 45, (equation) written:

$$R_{CHPout} = (10)100\frac{ns}{100pF} = 10k\Omega$$

should read $$R_{CHPout} = (10)\frac{100ns}{100pF} = 10k\Omega$$

Column 9,
Line 59, "and a plurality of .enable inputs, said external high" should be written -- and a plurality of enable inputs, said external high --

Signed and Sealed this

Twenty-eighth Day of December, 2004

JON W. DUDAS
*Director of the United States Patent and Trademark Office*